United States Patent
Chidambarrao et al.

(10) Patent No.: US 7,446,062 B2
(45) Date of Patent: Nov. 4, 2008

(54) DEVICE HAVING DUAL ETCH STOP LINER AND REFORMED SILICIDE LAYER AND RELATED METHODS

(75) Inventors: Dureseti Chidambarrao, Weston, CT (US); Ying Li, Newburgh, NY (US); Rajeev Malik, Pleasantville, NY (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 10/905,027

(22) Filed: Dec. 10, 2004

(65) Prior Publication Data
US 2006/0128145 A1   Jun. 15, 2006

(51) Int. Cl.
*H01L 21/318* (2006.01)
*H01L 21/44* (2006.01)

(52) U.S. Cl. .................... 438/791; 438/655; 438/682

(58) Field of Classification Search .......... None
See application file for complete search history.

(56) References Cited

U.S. PATENT DOCUMENTS

| 4,316,209 | A  | * | 2/1982  | Ho et al. ............... 257/765 |
| 5,972,785 | A  | * | 10/1999 | Shishiguchi et al. ... 438/592 |
| 7,052,946 | B2 | * | 5/2006  | Chen et al. ............ 438/199 |
| 2006/0121665 | A1 | * | 6/2006 | Fang et al. ............ 438/199 |

* cited by examiner

*Primary Examiner*—Zandra Smith
*Assistant Examiner*—Pamela E Perkins
(74) *Attorney, Agent, or Firm*—Hoffman Warnick LLC; Yuanmin Cai

(57) ABSTRACT

The present invention provides a semiconductor device having dual silicon nitride liners and a reformed silicide layer and related methods for the manufacture of such a device. The reformed silicide layer has a thickness and resistance substantially similar to a silicide layer not exposed to the formation of the dual silicon nitride liners. A first aspect of the invention provides a method for use in the manufacture of a semiconductor device comprising the steps of applying a first silicon nitride liner to a silicide layer, removing a portion of the first silicon nitride liner, reforming a portion of the silicide layer removed during the removal step, and applying a second silicon nitride liner to the silicide layer.

16 Claims, 4 Drawing Sheets

DEVICE HAVING DUAL ETCH STOP LINER AND REFORMED SILICIDE LAYER AND RELATED METHODS

BACKGROUND OF THE INVENTION

(1) Technical Field

The present invention relates generally to semiconductor devices and more particularly to an NFET/PFET device having dual etch stop liners and silicate layers of normal thickness and resistance.

(2) Related Art

The application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents).

One way to apply such stresses to a FET is the use of intrinsically-stressed barrier silicon nitride liners. For example, a tensile-stressed silicon nitride liner may be used to cause tension in an NFET channel while a compressively-stressed silicon nitride liner may be used to cause compression in a PFET channel. Accordingly, a dual/hybrid liner scheme is necessary to induce the desired stresses in an adjacent NFET and PFET.

In the formation of a dual/hybrid barrier silicon nitride liners for stress enhancement of NFET/PFET devices, the first deposited liner must be removed in one of the two FET regions by patterning and etching. For example, FIG. 1 shows a typical device 100 comprising a buried silicon dioxide (BOX) 110, a shallow trench isolation (STI) 120, an NFET 140, a spacer 142, a PFET 150, a spacer 152, and a suicide layer 130a-d. Suicide layer 130a-d may be any material known in the art, including, for example, cobalt silicate ($CoSi_2$), titanium silicate ($TiSi_2$), molybdenum silicate ($MoSi_2$), tungsten silicate ($WSi_2$), nickel silicate ($Ni_xSi_y$), and tantalum silicate ($TaSi_2$).

FIG. 2 shows the deposition of a first silicon nitride liner 160 onto device 100. In this case, first silicon nitride liner 160 is a tensile silicon nitride, although other silicon nitrides may be used, including, for example, a compressive silicon nitride. In order to form a dual/hybrid liner, a portion of first silicon nitride liner 160 must be removed from one of the FET regions. In order to ensure sufficient contact of a second deposited liner, it is preferable that first silicon nitride liner 160 be completely removed from the chosen FET region. However, complete removal of first silicon nitride liner 160 requires an over etch, necessarily resulting in some etching of underlying silicate layer 130a-d.

Referring to FIG. 3, the masking of NFET 140 and etching of tensile silicon nitride liner 160 adjacent PFET 150 results in an etched silicate layer 132a-b adjacent PFET 150. Etching may be by any means known in the art, including, for example, anisotropic reactive ion etching (RIE).

In methods currently known in the art, a second silicon nitride liner is deposited onto device 100 after etching, resulting in silicate layers of different thicknesses adjacent NFET 140 and PFET 150. In addition to a difference in thickness, etched silicate layer 132a-b exhibits increased silicate resistance ($R_s$) relative to silicate layer 130a-b.

Silicate layer 130a-b normally has a thickness between about 15 nm and about 50 nm, with a corresponding $R_s$ between about 6 ohm/sq and about 20 ohm/sq. By comparison, etched silicate layer 132a-b may have a thickness between about 5 nm and about 40 nm, with a corresponding $R_s$ between about 12 ohm/sq and about 40 ohm/sq.

Particularly in technologies beyond 90 nm, which utilize very ultra small gate lengths (e.g., <35 nm) and diffusion widths (e.g., <100 nm), such an increase in $R_s$ is unacceptable for at least two reasons. First, the increases in $R_s$ will impact performance of the device. Second, erosion of the silicate layer during the over etch increases the chance of failure by the polysilicon conductor (PC)-opens mechanism (i.e., the silicate on top of the PC is eroded or absent).

Accordingly, a need exists for a semiconductor device having dual etch stop liners and silicate layers of normal thickness and resistance and methods for the manufacture of such a device.

SUMMARY OF THE INVENTION

The present invention provides a semiconductor device having dual silicon nitride liners and a reformed silicate layer and related methods for the manufacture of such a device. The reformed silicate layer has a thickness and resistance substantially similar to a silicate layer not exposed to the formation of the dual silicon nitride liners. A first aspect of the invention provides a method for use in the manufacture of a semiconductor device comprising the steps of applying a first silicon nitride liner to a silicate layer, removing a portion of the first silicon nitride liner, reforming a portion of the silicate layer removed during the removal step, and applying a second silicon nitride liner to the silicate layer.

A second aspect of the invention provides a method for use in the manufacture of a semiconductor device having an NFET and a PFET, comprising the steps of applying a first silicon nitride liner to the NFET, PFET, and a silicate layer adjacent at least one of the NFET and the PFET, removing a portion of the first silicon nitride liner adjacent one of the NFET and the PFET, reforming a portion of the silicate layer removed during the removal step, and applying a second silicon nitride liner to the reformed silicate layer and the one of the NFET and the PFET.

A third aspect of the invention provides a method of reforming a portion of a silicate layer, comprising the steps of applying a metal layer to a remaining portion of an etched silicate layer, and forming a silicate with the metal layer and the remaining portion of the silicate layer.

A fourth aspect of the invention provides a semiconductor device, comprising a first silicon nitride liner, a second silicon nitride liner, and a partially reformed silicate layer, wherein a portion of the silicate layer is formed by the resilicidation of a deposited metal.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
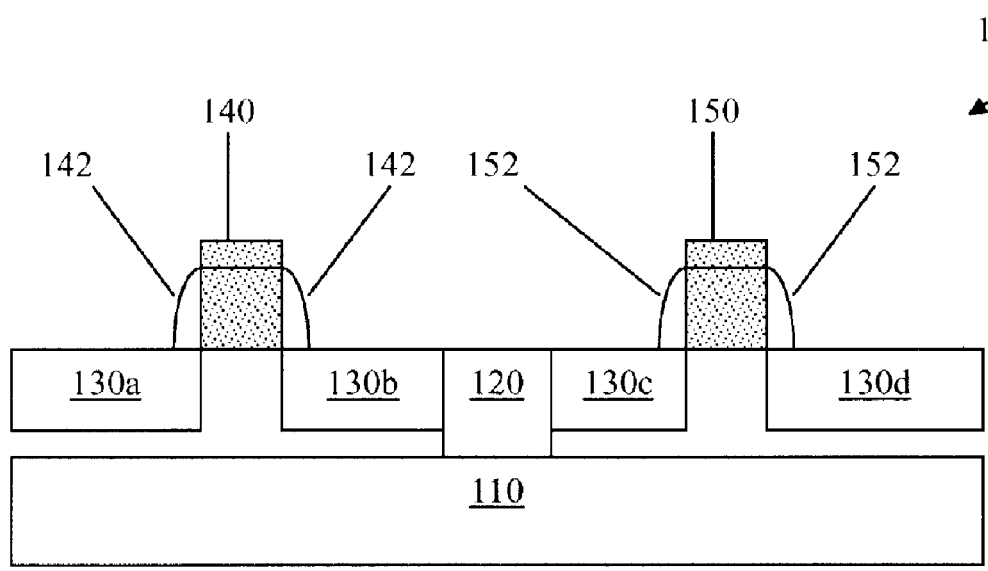
FIG. 1 shows a prior art device including an NFET/PFET.
Figure 2:
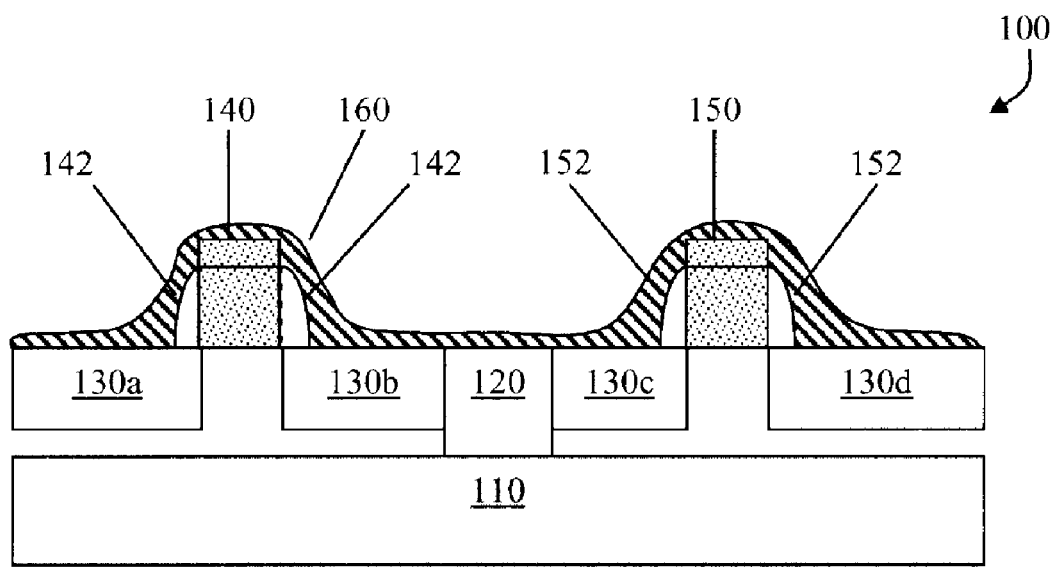
FIG. 2 shows deposition of a first silicon nitride liner to the prior art device of FIG. 1.
Figure 3:
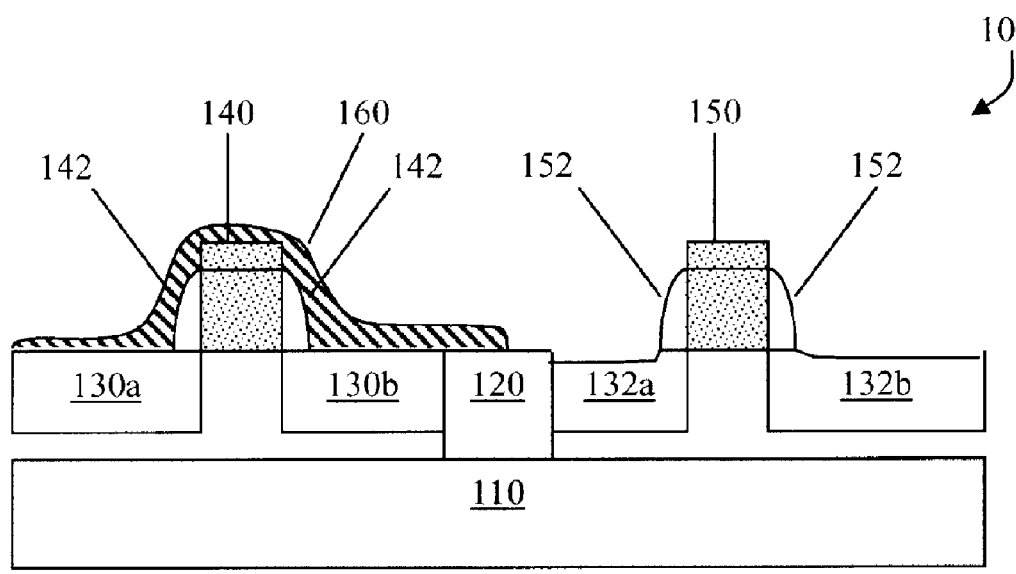
FIG. 3 shows damage to a silicate layer after etching the first silicon nitride liner from a portion of the prior art device of FIG. 2.
Figure 4:
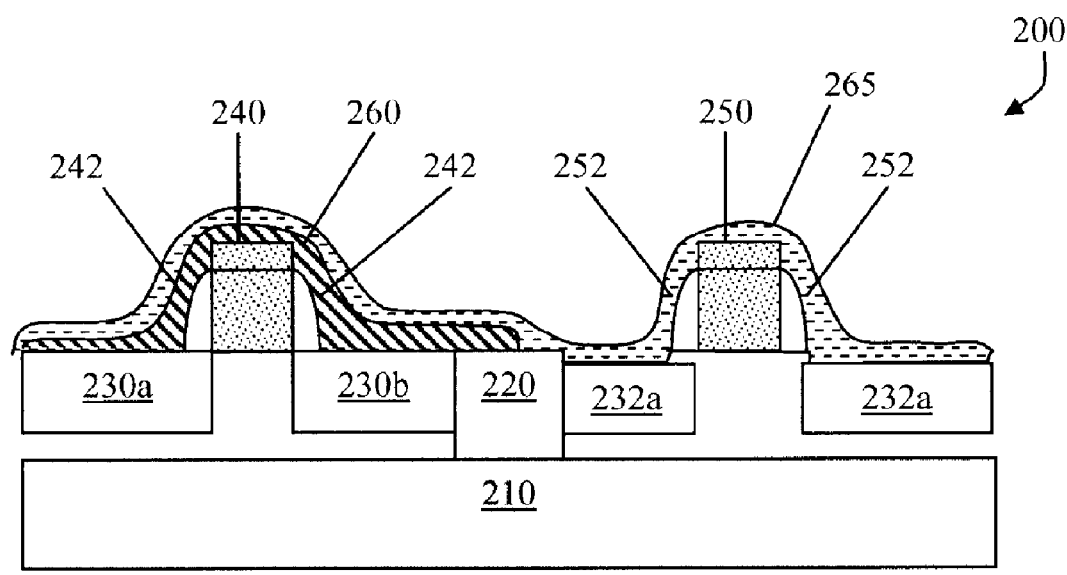
FIG. 4 shows deposition of a metal layer to the device of FIG. 3.

Referring to FIG. 4, after processing in a manner substantially the same as that shown in the steps of FIGS. 1-3, a metal layer 265 is applied to device 200. Metal layer 265 includes a metal present in the metal-silicon alloy of silicide layer 230a-b, 232a-b. For example, where silicate layer 230a-b, 232a-b is cobalt silicate ($CoSi_2$), metal layer 165 includes cobalt (Co).

Figure 5:
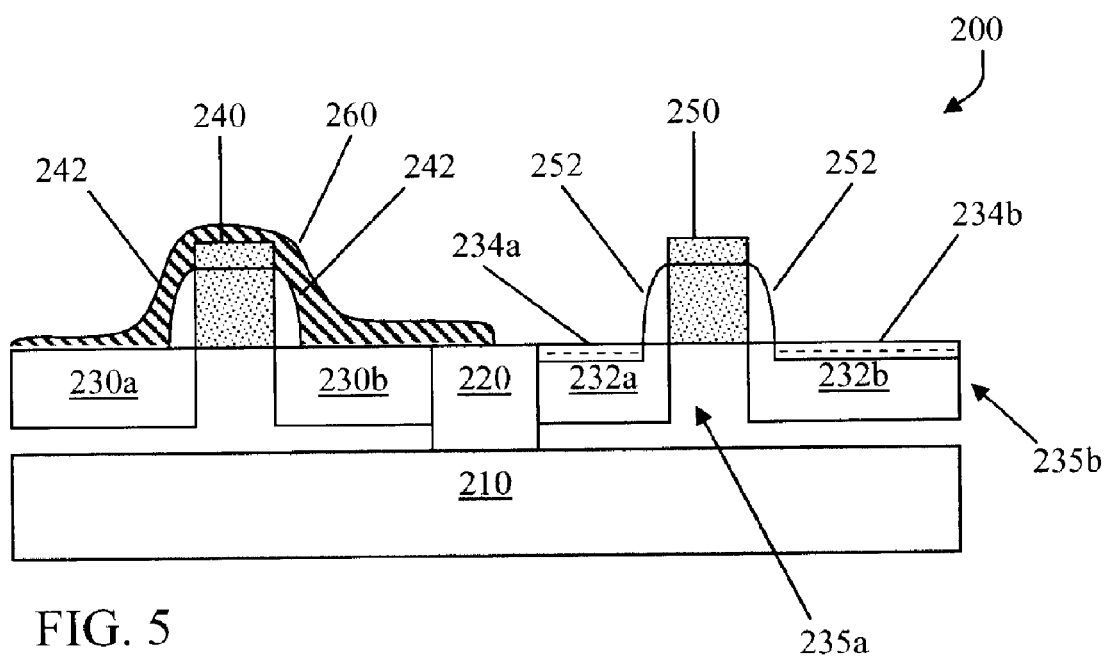
FIG. 5 shows a reformed silicate layer following solicitation of the metal layer in FIG. 4.

In FIG. 5, a reformed silicate layer 234a-b is formed on the surface of etched silicate layer 232a-b by a sintering process and any unsilicidated metal layer is removed. Together, etched silicate layer 232a-b and reformed silicate layer 234a-b make up resilicided layer 235a-b, having substantially the same thickness and resistance as silicate layer 230a-b. Alternatively, resilicided layer 235a-b may be thicker than silicate layer 230a-b, with a corresponding decrease in $R_s$. Thus, the device and methods of the present invention avoid both the physical thinning of the silicate layer and the resulting increase in silicate resistance.

Figure 6:
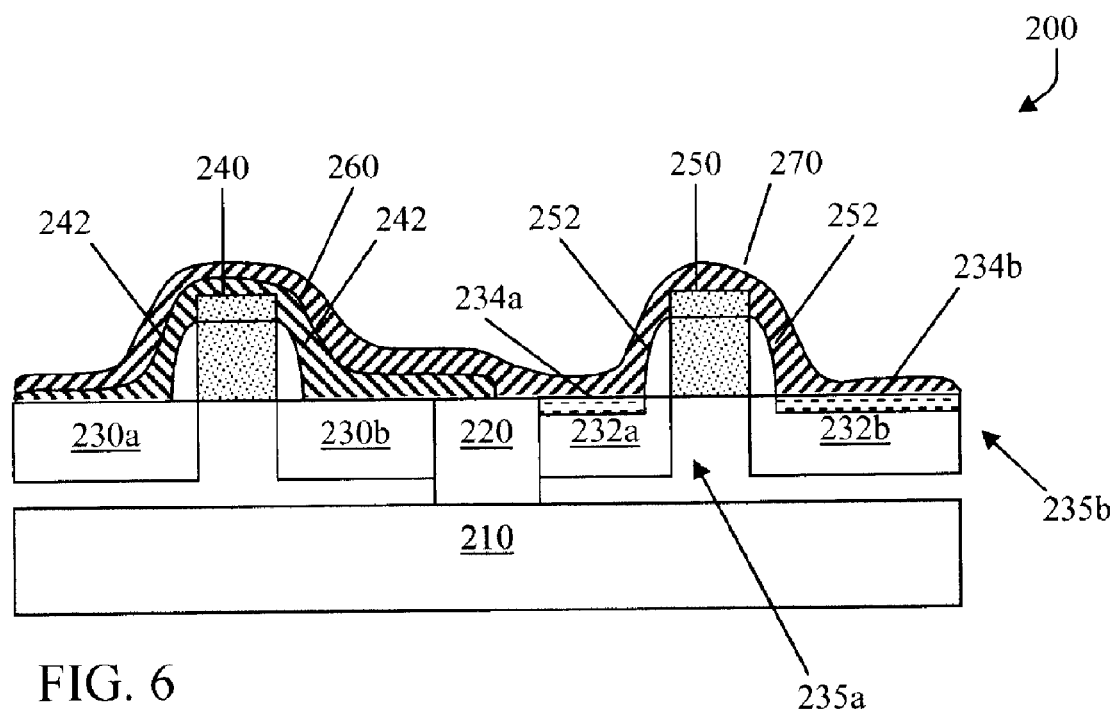
FIG. 6 shows deposition of a second silicon nitride liner to the device of FIG. 5.

Referring now to FIG. 6, a compressive nitride liner 270 is applied to device 200. Suitable silicon nitride liners may be formed by plasma enhanced chemical vapor deposition (PECVD), rapid thermal chemical vapor deposition (RTCVD), or low pressure chemical vapor deposition (LPCVD). Formation by any of these methods is generally done at a temperature between about 400° C. and about 750° C.

Figure 7:
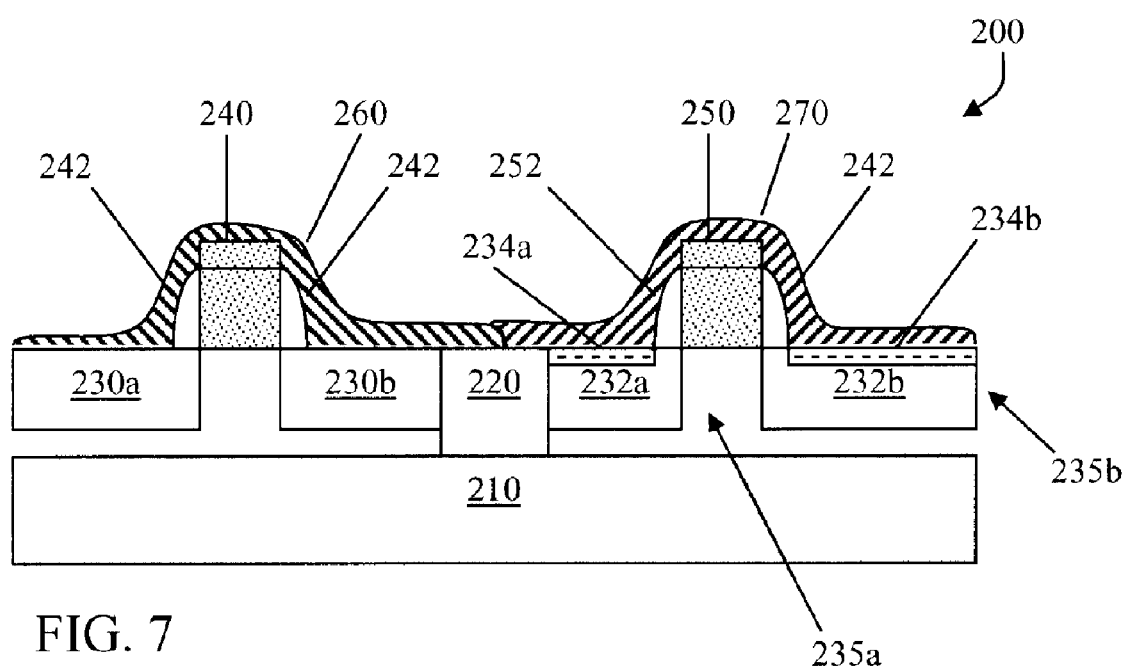
FIG. 7 shows a finished device according to the invention.

Finally, in FIG. 7, compressive silicon nitride liner 270 has been masked in an area adjacent PFET 250 and etched in an area adjacent tensile silicon nitride liner 260, forming the finished device 200 of the invention. Device 200 of FIG. 7 has a hybrid/dual etch stop liner 260, 270 and a resilicided layer 235a-b including etched silicate layer 232a-b and reformed silicate layer 234a-b. Thus, device 200 provides a hybrid/dual etch stop liner 260, 270 without the increased silicate resistance associated with methods and devices known in the art.

While formation of device 200 has been described as involving the deposition of a tensile silicon nitride liner 260 and the later deposition of a compressive silicon nitride liner 270, it should be appreciated that the order of deposition of these liners may be reversed. That is, it is also within the scope of the present invention to form device 200 by the first deposition of a compressive silicon nitride liner 270, etching of compressive silicon nitride liner 270 from an area around NFET 240, resilicidation of etched silicate layer 232a-b (this time adjacent NFET 240 rather than PFET 250), deposition of a tensile silicon nitride liner 260, and patterning and etching of tensile silicon nitride liner 260 from an area around PFET 250.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for use in the manufacture of a semiconductor device comprising the steps of:
   applying a first silicon nitride liner to a silicide layer;
   removing a portion of the first silicon nitride liner;
   reforming a portion of the silicide layer removed during the removal step; and
   applying a second silicon nitride liner to the silicide layer, wherein at least one of a thickness and a resistance of the reformed silicide layer is substantially the same as before the removing step.

2. The method of claim 1, further comprising the step of removing a portion of the second silicon nitride liner.

3. The method of claim 1, wherein at least one of the first and second silicon nitride liners is formed by at least one of PECVD, RTCVD, and LPCVD.

4. The method of claim 1, wherein the first silicon nitride liner is a tensile silicon nitride liner.

5. The method of claim 1, wherein the second silicon nitride liner is a compressive silicon nitride liner.

6. The method of claim 1, wherein the reforming step comprises the steps of:
   applying a metal layer to the silicide layer; and
   forming a silicide with the metal layer and the silicide layer.

7. The method of claim 6, wherein the metal layer includes a metal present in the silicide layer.

8. The method of claim 7, wherein the metal is at least one of cobalt, titanium, molybdenum, tungsten, tantalum, nickel, and platinum.

9. The method of claim 6, further comprising the step of removing a portion of the metal layer not incorporated into the silicide.

10. The method of claim 1, wherein the reformed silicide layer is thicker than before the removing step.

11. A method for use in the manufacture of a semiconductor device having an NFET and a PFET, comprising the steps of:
   applying a first silicon nitride liner to the NFET, PEET, and a silicide layer adjacent at least one of the NFET and the PFET;
   removing a portion of the first silicon nitride liner adjacent one of the NFET and the PFET;
   reforming a portion of the silicide layer removed during the removal step; and
   applying a second silicon nitride liner to the reformed silicide layer and one of the NFET and the PFET, wherein at least one of a thickness and a resistance of the reformed silicide layer is substantially the same as before the removing step.

12. The method of claim 11, wherein the first silicon nitride liner is a tensile silicon nitride liner and the second silicon nitride liner is a compressive silicon nitride liner.

13. The method of claim 12, wherein the portion of the first silicon nitride liner removed is adjacent the PFET.

14. The method of claim 11, wherein stress enhancement is provided to at least one of the NFET and the PFET.

15. The method of claim 11, further comprising the step of removing a portion of the second silicon nitride liner from an area adjacent the first silicon nitride liner.

16. The method of claim 11, wherein the reforming step comprises the steps of:
   applying a metal layer to the silicide layer; and
   forming a silicide with the metal layer and the silicide layer.

* * * * *